United States Patent
Krieger et al.

(10) Patent No.: US 7,113,420 B2
(45) Date of Patent: Sep. 26, 2006

(54) MOLECULAR MEMORY CELL

(75) Inventors: Juri H Krieger, Brookline, MA (US); Nicolay F Yudanov, Brookline, MA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 80 days.

(21) Appl. No.: 11/034,078

(22) Filed: Jan. 12, 2005

(65) Prior Publication Data

US 2005/0111271 A1    May 26, 2005

Related U.S. Application Data

(62) Division of application No. 10/139,748, filed on May 7, 2002, now Pat. No. 6,873,540.

(60) Provisional application No. 60/289,058, filed on May 7, 2001, provisional application No. 60/289,060, filed on May 7, 2001.

(51) Int. Cl.
*G11C 11/00* (2006.01)
*G11C 13/00* (2006.01)

(52) U.S. Cl. ............... 365/151; 365/100; 365/148; 365/153

(58) Field of Classification Search ............... None
See application file for complete search history.

(56) References Cited

U.S. PATENT DOCUMENTS

| | | |
|---|---|---|
| 3,719,933 A | 3/1973 | Wakabayashi et al. |
| 3,810,127 A | 5/1974 | Hoff, Jr. |
| 4,267,558 A | 5/1981 | Guterman |
| 4,267,583 A | 5/1981 | Suzuki |
| 4,371,883 A | 2/1983 | Potember et al. |
| 4,616,340 A | 10/1986 | Hayashi et al. |
| 4,631,562 A | 12/1986 | Avery |
| 4,652,894 A | 3/1987 | Potember et al. |
| 4,677,742 A | 7/1987 | Johnson |
| 4,727,514 A | 2/1988 | Bhuva et al. |
| 4,733,375 A | 3/1988 | Terashima |
| 4,834,911 A | 5/1989 | Carew |
| 4,839,700 A | 6/1989 | Ramesham et al. |
| 4,860,254 A | 8/1989 | Pott et al. |
| 5,012,445 A | 4/1991 | Kazuaki et al. |
| 5,034,192 A | 7/1991 | Wrighton et al. |
| 5,130,380 A | 7/1992 | Carew |
| 5,136,212 A | 8/1992 | Eguchi et al. |

(Continued)

FOREIGN PATENT DOCUMENTS

DE    196 40 239 A1    4/1998

(Continued)

OTHER PUBLICATIONS

"A Distrupted Organic Film: Could Memories Be Made of This?," *ORNL Review*, vol. 33, No. 2, 2000.

(Continued)

*Primary Examiner*—Son L. Mai
(74) *Attorney, Agent, or Firm*—Amin & Turocy, LLP

(57) ABSTRACT

A memory cell is provided with a pair of electrodes, and an active layer sandwiched between the electrodes and including a molecular system and ionic complexes distributed in the molecular system. The active layer having a high-impedance state and a low-impedance state switches from the high-impedance state to the low-impedance state when an amplitude of a writing signal exceeds a writing threshold level, to enable writing information into the memory cell. The active layer switches from the low-impedance state to the high-impedance state when an amplitude of an erasing signal having opposite polarity with respect to the writing signal exceeds an erasing threshold level, to enable erasing information from the memory cell.

20 Claims, 9 Drawing Sheets

U.S. PATENT DOCUMENTS

| | | | |
|---|---|---|---|
| 5,153,681 A | 10/1992 | Kishimoto et al. |
| 5,196,912 A | 3/1993 | Matsumoto et al. |
| 5,206,525 A | 4/1993 | Yamamoto et al. |
| 5,245,543 A | 9/1993 | Smayling et al. |
| 5,296,716 A | 3/1994 | Ovshinsky et al. |
| 5,315,131 A | 5/1994 | Kishimoto et al. |
| 5,319,564 A | 6/1994 | Smayling et al. |
| 5,355,235 A | 10/1994 | Nishizawa et al. |
| 5,392,236 A | 2/1995 | Hashimoto |
| 5,412,614 A | 5/1995 | Bird |
| RE34,974 E | 6/1995 | Terashima |
| 5,431,883 A | 7/1995 | Barraud |
| 5,440,518 A | 8/1995 | Hazani |
| 5,563,081 A | 10/1996 | Ozawa |
| 5,572,472 A | 11/1996 | Kearney et al. |
| 5,579,199 A | 11/1996 | Kawamura et al. |
| 5,670,818 A | 9/1997 | Forouhi et al. |
| 5,691,935 A | 11/1997 | Douglass |
| 5,698,874 A | 12/1997 | Hayashi |
| 5,734,605 A | 3/1998 | Zhu et al. |
| 5,761,115 A | 6/1998 | Kozicki et al. |
| 5,770,885 A | 6/1998 | McCollum et al. |
| 5,818,749 A | 10/1998 | Harshfield |
| 5,849,403 A | 12/1998 | Aoki et al. |
| 5,869,882 A | 2/1999 | Chen et al. |
| 5,896,312 A | 4/1999 | Kozicki et al. |
| 5,900,662 A | 5/1999 | Frisina et al. |
| 5,914,893 A | 6/1999 | Kozicki et al. |
| 6,055,180 A | 4/2000 | Gudesen et al. |
| 6,060,338 A | 5/2000 | Tanaka et al. |
| 6,064,589 A | 5/2000 | Walker |
| 6,088,319 A | 7/2000 | Gudesen |
| 6,118,684 A | 9/2000 | Yihong et al. |
| 6,128,214 A | 10/2000 | Kuekes et al. |
| 6,150,705 A | 11/2000 | Chen |
| 6,288,697 B1 | 9/2001 | Eto et al. |
| 6,292,396 B1 | 9/2001 | Tailliet |
| 6,326,936 B1 | 12/2001 | Inganas et al. |
| 6,349,054 B1 | 2/2002 | Hidaka |
| 6,353,559 B1 | 3/2002 | Hasegawa et al. |
| 6,384,427 B1 | 5/2002 | Yamazaki et al. |
| 6,403,396 B1 | 6/2002 | Gudesen et al. |
| 6,403,397 B1 | 6/2002 | Katz |
| 6,407,953 B1 | 6/2002 | Cleeves |
| 6,418,049 B1 | 7/2002 | Kozicki et al. |
| 6,424,553 B1 | 7/2002 | Berggren et al. |
| 6,426,891 B1 | 7/2002 | Katori |
| 6,429,457 B1 | 8/2002 | Berggren et al. |
| 6,432,739 B1 | 8/2002 | Gudesen et al. |
| 6,449,184 B1 | 9/2002 | Kato et al. |
| 6,459,095 B1 | 10/2002 | Heath et al. |
| 6,461,916 B1 | 10/2002 | Adachi et al. |
| 6,487,106 B1 | 11/2002 | Kozicki et al. |
| 6,806,526 B1* | 10/2004 | Krieger et al. ............. 258/296 |
| 6,956,761 B1* | 10/2005 | Campbell ................. 365/151 |
| 2001/0014038 A1 | 8/2001 | Hasegawa et al. |
| 2001/0054709 A1 | 12/2001 | Heath et al. |
| 2001/0055384 A1 | 12/2001 | Yamazaki et al. |
| 2002/0027819 A1 | 3/2002 | Tomanek et al. |
| 2002/0101763 A1 | 8/2002 | Hosogane et al. |
| 2002/0104889 A1 | 8/2002 | Forrest et al. |
| 2002/0125504 A1 | 9/2002 | Perlov et al. |
| 2002/0134979 A1 | 9/2002 | Yamazaki et al. |
| 2002/0163030 A1 | 11/2002 | Mandell et al. |
| 2002/0163057 A1 | 11/2002 | Bulovic et al. |
| 2002/0163828 A1 | 11/2002 | Krieger et al. |
| 2002/0163829 A1 | 11/2002 | Bulovic et al. |
| 2002/0163830 A1 | 11/2002 | Bulovic et al. |
| 2002/0163831 A1 | 11/2002 | Krieger et al. |
| 2002/0168820 A1 | 11/2002 | Kozicki et al. |

FOREIGN PATENT DOCUMENTS

| | | |
|---|---|---|
| DE | 199 59 904 A1 | 6/2001 |
| EP | 0 268 370 A3 | 5/1988 |
| EP | 0 385 688 A2 | 9/1990 |
| EP | 0 727 822 A2 | 8/1996 |
| JP | 7-106440 | 4/1995 |
| RU | 2071126 C1 | 12/1996 |
| WO | WO 93/04506 A1 | 3/1993 |
| WO | WO 99/04440 A1 | 1/1999 |
| WO | WO 99/08325 A2 | 2/1999 |
| WO | WO 99/14762 A1 | 3/1999 |
| WO | WO 99/19900 A2 | 4/1999 |
| WO | WO 00/26918 A1 | 5/2000 |
| WO | WO 00/48196 A1 | 8/2000 |
| WO | WO 02/35580 A2 | 5/2002 |
| WO | WO 02/37500 A1 | 5/2002 |
| WO | WO 02/43071 A1 | 5/2002 |
| WO | WO 02/078003 A2 | 10/2002 |
| WO | WO 02/091384 A1 | 11/2002 |
| WO | WO 02/091385 A1 | 11/2002 |
| WO | WO 02/091476 A1 | 11/2002 |
| WO | WO 02/091494 A1 | 11/2002 |
| WO | WO 02/091495 A2 | 11/2002 |
| WO | WO 02/091496 A2 | 11/2002 |
| WO | WO 03/017282 A1 | 2/2003 |

OTHER PUBLICATIONS

"Technical Summary of Programmable Metallization Cell Memory Technology," Version 1.3, Dec. 2001.

"The 1998 Conference Archive," *The Sixth Foresight Conference on Molecular Nanotechnology*, Nov. 12-15, 1998, www.foresight.org/Conferences/MNT6/index.html.

Beck, A. et al., "Reproducible Switching Effect in Thin Oxide Films for Memory Applications," *Applied Physics Letters*, vol. 77, No. 1, pp. 139-141, Jul. 3, 2000.

Bernard, Allen, "A Big Name in Chips Helps Coatue in Molecular Memory Race," Aug. 27, 2000, www.nanoelectronicsplanet.com/features/article/0,4028,6571-1452831,00.html.

Chen, J. et al., "Room-temperature Negative Differential Resistance in Nanoscale Molecular Junctions," *Applied Physics Letters*, vol. 77, No. 8, Aug. 21, 2000.

Collier, C. P. et al., "Electrically Configurable Molecular-Based Logic Gates," *Science*, vol. 285, pp. 391-394, Jul. 16, 1999.

Gannon, Andrew, "Toward the Next Generation CD," *Physical Review Focus*, Feb. 16, 2000.

Gao, H. J. et al., "Reversible, Nanometer-Scale Conductance Transitions in an Organic Complex," *Physical Review Letters*, vol. 84, No. 8, pp. 1780-1783, Feb. 21, 2000.

Gao, H. J. et al., "Using a New Kind of Organic Complex System of Electrical Bistability for Ultrahigh Density Data Storage," J. Vac. Sci. Technol. B vol. 15, No. 4, pp. 1581-1583, Jul./Aug. 1997.

International Search Report, PCT/RU01/00334, search completed Feb. 14, 2002.

International Search Report, PCT/US02/14236, search completed Aug. 14, 2002.

International Search Report, PCT/US02/14237, search completed Sep. 9, 2002.

International Search Report, PCT/US02/14238, search completed Aug. 9, 2002.

International Search Report, PCT/US02/14239, search completed Aug. 20, 2002.

International Search Report, PCT/US02/14269, search completed Mar. 27, 2003.

International Search Report, PCT/US02/14270, search completed Mar. 28, 2003.

Japanese patent abstract of publication No. 01-103137, Apr. 20, 1989.

Japanese patent abstract of publication No. 01278781, Nov. 9, 1989.

Japanese patent abstract of publication No. 61107723, May 26, 1986.

Japanese patent abstract of publication No. 63293729, Nov. 30, 1998.

Krieger, Ju. H. et al., "Molecular Analogue Memory Cell Based on Electrical Switching and Memory in Molecular Thin Films," *Synthetic Metals*, 7730 (2000), pp. 1-4.

Krieger, Juri H. et al., "Molecular Analogue Memory Cell," *Sixth Foresight Conference on Molecular Nanotechnology*, Santa Clara, California, Nov. 12-15, 1998.

Krieger, Yu. G. et al., "Study of Test Structures of a Molecular Memory Element," *Institute of Inorganic Chemistry*, Siberian Branch, Russian Academy of Sciences. Translated from *Zhurnal Strukturnoi Khimii*, vol. 34, No. 6, pp. 152-156, Nov.-Dec. 1993. Original article submitted Apr. 27, 1993.

Krieger, Yu. G., "Molecular Electronics: Current State and Future Trends," *Journal of Structural Chemistry*, vol. 34, No. 6, pp. 896-904, Nov.-Dec. 1993.

Krieger, Yu. H., "Structural Instability of One-Dimensional Systems as a Physical Principle Underlying the Functioning of Molecular Electronic Devices," *Journal of Structural Chemistry*, vol. 40, No. 4, pp. 594-619, Jul.-Aug. 1999.

Kurita, Ryo et al., "Field Modulation Effects on Charge-Density-Wave Conduction in $NbSe_3$," *Physica B*, 284-288 (2000), pp. 1161-1662.

Ma, L. P. et al., "Data Storage With 0.7 nm Recording Marks on a Crystalline Organic Thin Film by a Scanning Tunneling Microscope," *Applied Physics Letters*, vol. 73, No. 6, pp. 850-852, Aug. 10, 1998.

Ma, L.P. et al., "Nanometer-Scale Recording on an Organic Complex Thin Film With a Scanning Tunneling Microscope," *Applied Physics Letters*, vol. 69, No. 24, pp. 3752-3753, Dec. 9, 1996.

Machida, Yasuhiko et al., "Electrical Switching in Evaporated Lead Phthalocyanine Films," *Japanese Journal of Applied Physics*, vol. 28, No. 2, pp. 297-298, Feb. 1989.

Ovshinsky, Stanford R., "Localized States in the Gap of Amorphous Semiconductors," *Physical Review Letters*, vol. 36, No. 24, pp. 1469-1472, Jun. 14, 1976.

Reed, M.A. et al., "Molecular Random Access Memory Cell," *Applied Physics Letters*, vol. 78, No. 23, pp. 3735-3737, Jun. 4, 2001.

Rossel, C. et al., "Electrical Current Distribution Across a Metal-Insulator-Metal Structure During Bistable Switching," Apr. 24, 2001.

Rotman, David, "Molecular Memory," *Technology Review*, May 2001.

*Semiconductor Times*, pp. 5-6, Jul. 2002.

Stikeman, Alexandra, "Polymer Memory: The Plastic Path to Better Data Storage," *Technology Review*, p. 31, Sep. 2002.

Zhou, C. et al., "Nanoscale Metal/Self-Assembled Monolayer/Metal Heterostructures," *Applied Physics Letters*, vol. 71, No. 5, pp. 611-613, Aug. 4, 1997.

\* cited by examiner

MOLECULAR MEMORY CELL

RELATED APPLICATIONS

This application is a divisional of U.S. patent application Ser. No. 10/139,748, filed on May 7, 2002, entitled MOLECULAR MEMORY CELL now U.S. Pat. No. 6,873, 540, which claims the benefit of U.S. Provisional Application Ser. No. 60/289,058, filed on May 7, 2001, and entitled MULTI-BIT MEMORY CELL, and U.S. Provisional Application Ser. No. 60/289,060, filed on May 7, 2001, and entitled COMPOSITE MOLECULAR SWITCHING DEVICE, all of which are hereby incorporated by reference.

FIELD OF THE INVENTION

The invention relates to a molecular memory cell for data storage applications, and, more particularly, to a memory cell made of a composite molecular material.

BACKGROUND OF THE INVENTION

Computer data storage, in particular random access memory (RAM) has become an increasingly important component of electronic hardware. There are various distinct types of memory devices, distinguished by their speed and data retention characteristic. Dynamic random access memory (DRAM) is a volatile memory characterized by a destructive read. This means that it is necessary to supply voltage to the memory bits at all times, or the information will disappear. Furthermore, each memory element has associated with it a transistor. Static random access memory (SRAM) stores data in a bistable flip-flop, commonly consisting of cross-coupled inverters. It is called "static" because it will retain a value as long as power is supplied. It is still volatile, i.e. it will lose its contents when the power is switched off, in contrast to ROM. SRAM is usually faster than DRAM, but each bit requires several transistors (about six), so that a lesser number of bits of SRAM fit in the same area as compared to DRAM.

Erasable programmable read only memory (EPROM) is a type of storage device in which the data is determined by electrical charge stored in an isolated ("floating") MOS transistor gate. The isolation is good enough to retain the charge almost indefinitely (more than ten years) without an external power supply. The EPROM is programmed by "injecting" charge into the floating gate, using a technique based on the tunnel effect. This requires higher voltage than in normal operation. The floating gate can be discharged through UV-illumination or electrically (EEPROM). Usually bytes or words can be erased and reprogrammed individually during system operation. EEPROM is more expensive and less dense than RAM. It is appropriate for storing small amounts of data which is changed infrequently.

Most of these devices require complex silicon processing steps and a dedicated device architecture for the various memory types. It would therefore be desirable to provide a material with a predictable memory effect adaptable for short-term and long-term data retention and suitable for producing reliable and inexpensive memory and/or switching devices for data storage and data manipulation.

SUMMARY OF THE INVENTION

These and other needs are met by embodiments of the present invention, which provide devices and methods for storing information.

In accordance with one aspect of the present invention, a memory cell comprises a pair of electrodes, and an active layer provided between the electrodes and including a molecular system. Ionic complexes may be distributed in the molecular system. The active layer being configured to enable writing information into the memory cell when the amplitude of a writing signal exceeds a threshold level determined as a function of the duration of the writing signal.

Further, the active layer may be configured to enable reading the information written to the cell when the amplitude of a reading signal is no more than the threshold level.

In accordance with a further aspect of the present invention, the following steps are carried out to provide a method of storing information in a memory cell having an active layer including a molecular system and ionic complexes distributed in the molecular system: determining a threshold level for writing information into the memory cell based on the duration of a writing signal for writing information, and applying the writing signal having an amplitude exceeding the threshold level to write information into the memory cell.

In accordance with another aspect of the present invention, a switching device comprises an active region having a high-impedance state and a low-impedance state and including a molecular matrix and ionic complexes distributed in the matrix, each of the ionic complexes being composed of at least a pair of ions having opposite charges. The active region is responsive to a switching signal for switching between the high-impedance state and the low-impedance state when the amplitude of the switching signal exceeds a threshold level determined based on the duration of the switching signal. In particular, the switching signal may cause displacement of the ions in the ionic complexes to switch the active region from the high-impedance state to the low-impedance state.

In accordance with a further aspect of the present invention, a method of switching a device of the present invention involves determining a threshold level for switching the device based on the duration of a switching signal for switching the device, and applying the switching signal having an amplitude exceeding the threshold level to switch the device between the high-impedance state and the low-impedance state.

In accordance with another aspect of the present invention, a memory cell comprises a pair of electrodes, and an active layer including a molecular system and ionic complexes distributed in the molecular system. The active layer is configured to enable writing information into the memory cell when the intensity of an electric field applied to the active layer exceeds a threshold value, and to enable reading information from the memory cell when the absolute value of the electric field intensity is no more than the threshold value.

In accordance with a further aspect of the present invention, a method of storing information comprises the steps of applying to the active layer an electric field having intensity exceeding a threshold value to write data, and applying to the active layer the electric field having the absolute value of intensity no more than the threshold value to read the data.

In accordance with another aspect of the invention, a memory cell comprises a pair of electrodes, and an active layer including a molecular system, an ionic complex provided in the molecular system and including at least a pair of ions having opposite charges, and a trapping molecular group provided in the molecular system for trapping at least one of the ions included in the ionic complex.

In accordance with a further aspect of the invention, the following steps are carried out for supporting a method of switching a switching device: applying electric field having intensity exceeding a threshold level to displace the ions included in the ionic complex, in order to switch the switching device from a high-impedance state to a low-impedance state, and trapping at least one of the ions when the electric field intensity is no more than the threshold value to prevent the switching device from returning to the high-impedance state.

In accordance with a further aspect of the invention, a memory cell comprises a pair of electrodes, and an active region including a first active layer and a second active layer sandwiched between the electrodes, each of the first and second active layers including a molecular system and ionic complexes composed of at least a pair of ions, and a barrier layer provided between the first active layer and the second active layer for restricting movement of the ions between the first active layer and the second active layer.

In accordance with another aspect of the invention, a method of switching a switching device involves applying electric field having intensity exceeding a threshold value for switching the device from a high-impedance state to a low-impedance state by displacing the ions included in the ionic complex so as to place majority of the first ions into the first active layer and majority of the second ions into the second active layer, and providing a barrier layer between the first active layer and the second active layer to prevent the first ions from returning to the second active layer, when the electric field intensity is no more than the threshold value.

The foregoing and other features and aspects of the present invention would come more apparent from the following detailed description of the present invention when taken in conjunction with the accompanying drawings.

BRIEF DESCRIPTION OF THE DRAWINGS

The following figures depict certain illustrative embodiments of the invention. These depicted embodiments are to be understood as illustrative of the invention and not as limiting in any way.

DETAILED DESCRIPTION OF THE INVENTION

Figure 1A:
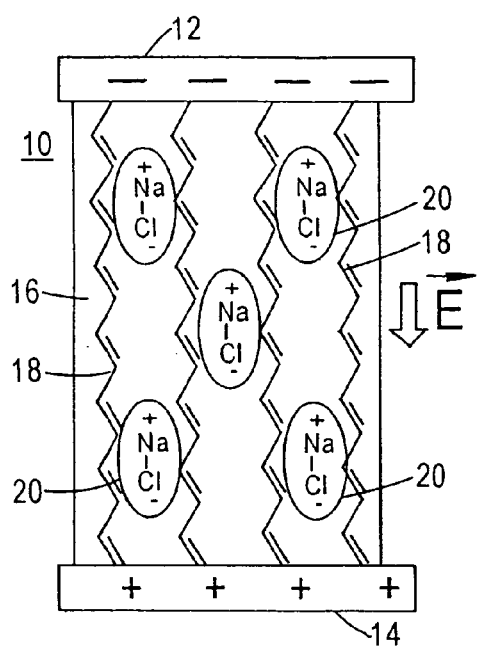
FIGS. 1a–d show a simplified structure of a molecular composite memory cell in accordance with an embodiment of the present invention in various operational states.

Provided herein is a molecular ensemble that exhibits a reproducible switching and memory effect applicable in practical devices. The material is a composite molecular system that exhibits structural electronic instability in one dimension and enables static and dynamic control over the conductivity of such molecular systems. The mechanism for the memory and switching effect of memory cells relates to the structural electronic instability of one-dimensional molecular systems and is associated with the dissociation of molecules and/or displacement of atoms under influence of an external electrical field.

The development of molecular electronics stimulated the more detailed research of electrophysical characteristics of thin molecular films which offer new physical effects that may result in new technologies for electrical switching and memory applications.

Molecular memory cells can be made of one-dimensional conductive molecular systems exhibiting structural instability. (Peierls-effect). These tend to have an S-shaped (reentrant) voltage-current characteristic with memory. The impedance of such memory cells can be between ~10 MΩ and ~100 Ω, depending on the switching condition.

There are two predominant types of structural organization of such systems. First, these are strands of linear conjugated polymers, which are weakly bonded to each other and whose mutual arrangement is generally poorly organized. Second, these are crystal structures, where the individual molecules form one-dimensional columns and interact with each other much more actively than molecules from different columns do. Recently, molecular systems of both types were synthesized.

The molecular memory cells of the present invention may employ polyconjugated systems primarily involving polyvinylenes, i.e., polymers with an acyclic conjugation system, in which the one-dimensional character of structure is dictated by the mechanism of conjugation in linear macromolecules. Polyacetylene is a classical representative of this class of polymers. Its electronic structure is a prototype for many other conjugated polymers.

Another wide class of molecular compounds that may be used in the molecular memory cell of the present invention is formed from aromatic and heterocyclic molecules which possess high electric conductivity due to π-bonds between molecules. Such molecular systems are called π-complexes or charge transfer complexes, with those systems whose structure involves isolated one-dimensional columns or strands possessing pronounced electro-physical properties of interest for switching an memory applications. Molecular charge transfer complexes are donor-acceptor systems formed from two molecules: one possessing donor and another acceptor properties. Among the well-defined complexes with a one-dimensional structure, tetra-cyano-quinodimethane (TCNQ) are planar molecules with unsaturated bonds, arranged in a crystal as parallel stacks forming a quasi-one-dimensional system.

In another class of one-dimensional systems that may be used in the memory cell of the present invention, the cations are dynamically disordered. It involves molecular compounds having the general formula $(TMTSF)_2X$. Transition metal salts of $K_2 Pt(CN)_4 Br_{0.3} \times 3H_2O$ (KCP) type are also the typical representatives of mixed-valence quasi-one-dimensional complexes, as are phthalocyanines and porphyrins. Moreover, pure inorganic compounds, such as $NbSe_3$, are also interesting examples of compounds with quasi-one-dimensional structure.

Materials that can be used for implementing the molecular system of the present invention are described in more detail in an article by one of the inventors of the present application, entitled "*Structural Instability of One-dimensional Systems as a Physical Principal Underlying the Functioning of Molecular Electronic Devices*," Journal of Structural Chemistry, Vol. 40, No. 4, 1999 (Yu. H. Krieger). This publication is hereby expressly incorporated by reference.

FIGS. 1a–1d illustrates memory operations in an exemplary molecular memory cell (MC) 10 of the present invention. The memory cell 10 comprises a pair of electrodes 12 and 14, and an active layer 16 containing a molecular composite including an ionic complex.

The electrodes 12 and 14 may be made of conductive material such as a metal, an oxide compound, semiconductor material, or a conducting polymer. For example, such metals as Al, Cu, or Ti, or such oxide compounds as Indium-Tin-Oxide (ITO) may be used.

The molecular composite employed in the active layer 16 includes a molecular system or matrix 18 and ionic complexes 20 distributed in the matrix. The molecular matrix 18 may be a quasi-one-dimensional or at least structurally and electrically anisotropic molecular system, such as molecular systems described above.

For example, polyconjugated compounds, such as polyphenylacetylene, can be used as the anisotropic molecular matrix. Alternatively, the molecular matrix may be formed of aromatic and/or heterocyclic molecules which possess high electric conductivity due to $\pi$-bonds between molecules.

In implementing embodiments of the present invention, ionic complexes 20 are distributed in the matrix. Each ionic complex 20 consists of at least two ions having opposite charges and combined into one molecule. For example, the ionic complex may be a salt, such as sodium chloride (NaCl) or cesium chloride (CsCl), or any other material that can dissociate under influence of an applied electric field. In the exemplary embodiment illustrated in FIG. 1a, the ionic complex is composed of positively charged ion of Na and negatively charged ion of Cl.

The exemplary anisotropic molecular matrix is depicted in FIGS. 1a–d as consisting of an assembly of chain-like molecules oriented perpendicular to the electrode surfaces. However, other orientations of those molecules or of anisotropic "channels" are possible as long as a ion separation of the type depicted in FIGS. 1a–d is enabled.

While not being bound by theory, the following is currently believed by the inventors to describe the mechanism for the conductivity change of the molecular composite material. Electric switching in the molecular thin films depicted in FIGS. 1a–d is characterized by the existence of two stable states, a high impedance state ("off" state) and a low impedance state ("on" state). The impedance of this "off" state is usually more than ~10 M$\Omega$. Switching from the "off" state to the "on" state occurs when an applied electric field exceeds a threshold value. The impedance of this "on" state is less than ~100 $\Omega$. A transition from "on" state back to the "off" state takes place when the polarity of the electric field is reversed.

Figure 1B:
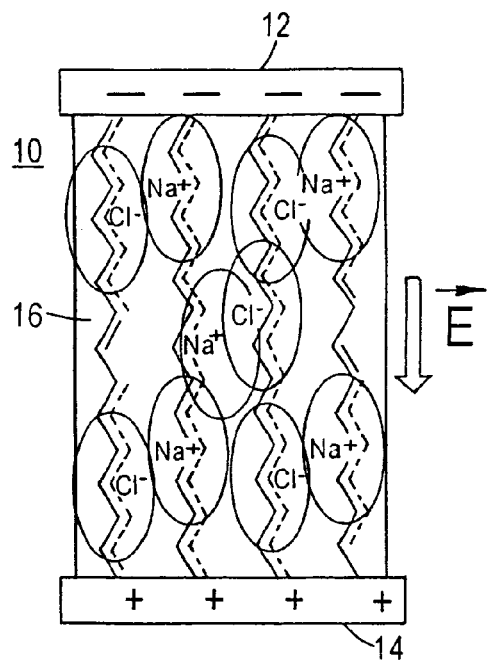
Figure 1C:
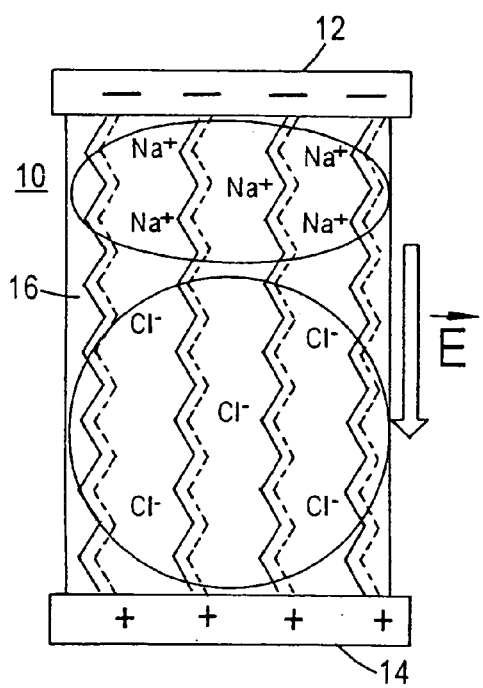
Figure 1D:
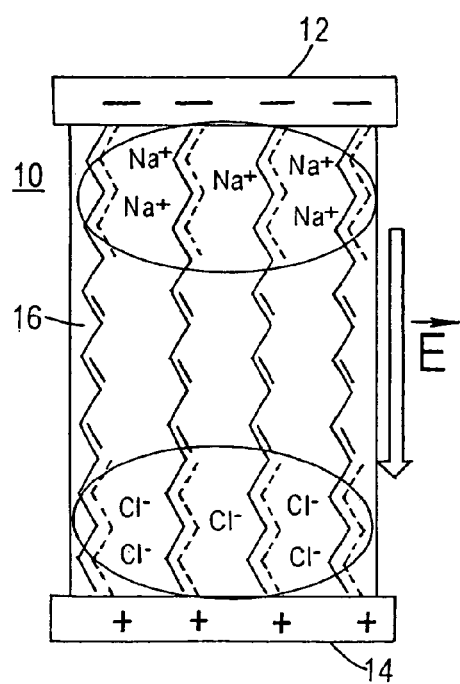

Two modes of the memory cell operation can be identified: a metastable mode (FIG. 1b) and a stable mode (FIG. 1c). The stable mode of the memory cell operation may be characterized by a high threshold voltage level for switching between the "off" state and the "on" state (in the range of about 3–10 V), low impedance of the "on" state (less than 100 $\Omega$), long switching time (about 1 ms and more) and long storage time (about two month and more). Some memory cells exhibit substantially unchanged electrical properties after storage for about six years.

Conversely, the metastable mode of the memory cell function is characterized by a low threshold voltage level for switching between the "off" state and the "on" state (in the range of about 0.1–0.5V), high impedance of the "on" state (in the wide range of about 1 k$\Omega$–1M$\Omega$), short switching time (less than 1 $\mu$s), and short storage time (from about 10 s to several hours).

FIG. 1a illustrates the "off" state, where the electrical conductivity is essentially zero, assuming that the anisotropic molecular matrix itself is a good electrical insulator.

FIG. 1b illustrates the "on" state in the metastable mode, when an applied external electric field has intensity E exceeding a threshold value established for the metastable mode. In the illustrated example, the electric field is applied between the electrodes 12 and 14. For example, the potential on the electrode 12 may be negative with respect to the potential on the electrode 14.

In the "on" state of the metastable mode, the sodium salt dissociates into sodium and chlorine ions, and the ions are displaced from their original position in the anisotropic molecular matrix, resulting in an increase in the electrical conductivity.

FIG. 1c illustrates the "on" state in the stable mode, when the electric filed intensity E exceeds a threshold value established for the stable mode, which is higher than the threshold value for the metastable state. Upon increase of the electric field intensity E, the sodium and chlorine ions become more strongly separated, accompanied by a further increase in the conductivity of the MC. For example, the electric field may be applied between the electrodes 12 and 14 to make the potential on the electrode 12 negative with respect to the potential on the electrode 14. The electric field having intensity E exceeding the threshold value for the stable state provides switching the MC 10 from the high impedance state to the low impedance state, i.e. supports writing information to the MC 10.

To erase information written into the MC 10, the electric field of opposite polarity is supplied between the electrodes 12 and 14, i.e. the erasing electric field provides the potential on the electrode 12 positive with respect to the potential on the electrode 14. When the intensity E of the erasing electric field having a polarity opposite to the polarity of the writing electric field exceeds the threshold value established for the stable mode, the MC 10 switches from the low impedance state or "on" state illustrated in FIG. 1c to the high impedance state or "off" state illustrated in FIG. 1a. As a result, the information written to the MC 10 is erased.

To read information written into the memory cell 10, the electric field of any polarity may be applied between the electrodes 12 and 14. However, to avoid accidental erasing of written information, it would be preferable to provide the electric field having the polarity of the electric field used for writing the information.

The absolute value of the intensity E of the electric field for reading information should be no more than the threshold value to prevent the active layer 16 from switching. The information written to the memory cell 10 may be read by measuring the impedance of the memory cell 10 to determine whether it is in the low impedance state or high impedance state.

When an electric field having a polarity of the writing electric field with a very large intensity E is applied over a long time, the anions Cl and cations Na accumulate at the opposite electrodes (FIG. 1d), resulting in a sharp decrease in the electrical conductivity of the MC due to the absence of mobile charges.

Figure 2:
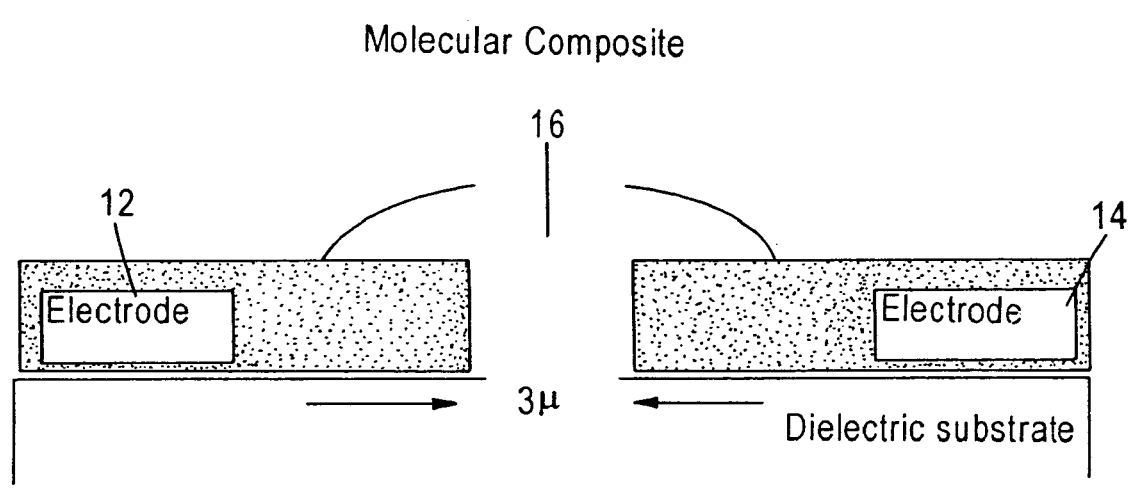
FIG. 2 shows a structure of a memory cell in accordance with an exemplary embodiment of the present invention.

FIG. 2 depicts an exemplary embodiment of the memory cell 10. In accordance with this exemplary embodiment, the spacing between the electrode 12 and the electrode 14 in the memory cell 10 is approximately 3 µm. The electrode material can be, for example, a metal, such as Al or Cu, oxide, such as ITO, a semiconductor or a conducting polymer. In implementing the exemplary embodiment of the memory cell 10, the transition from the "off" state depicted in FIG. 1a to the "on" state depicted in FIG. 1b requires application of an external voltage of approximately 3–5 V for a time period of approximately 10–100 ns. The transition from the "off" state depicted in FIG. 1a to the "on" state depicted in FIG. 1c having a higher electrical conductivity requires application of an external voltage of approximately 3–5 V for a time period of approximately 300 ns–1 µs.

Figure 3A:
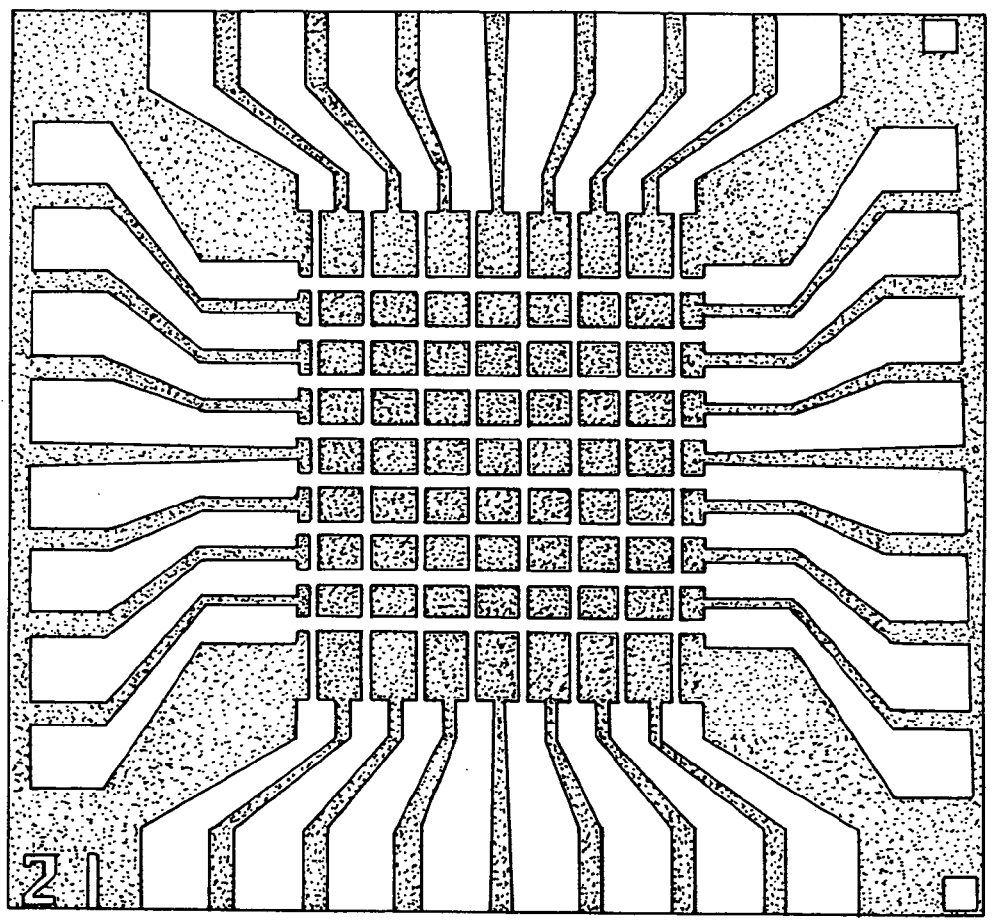
FIGS. 3a–b show a top view and a cross-sectional view of a memory cell array in accordance with an exemplary embodiment of the present invention.
Figure 3B:
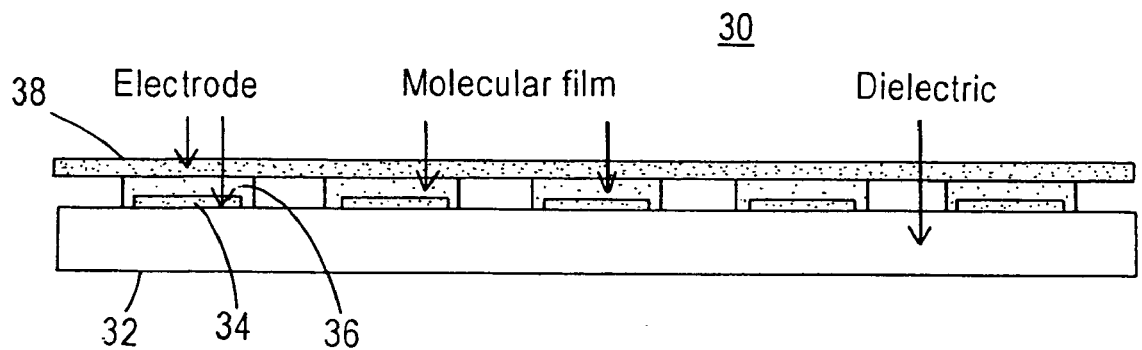

Referring now to FIGS. 3a–b, a memory cell array 30 in accordance with an embodiment of the present invention is composed of 8×8 memory cells 10, each of which contains an active area of 100 µm×100 µm. FIG. 3a is a top view and FIG. 3b a cross-sectional view of the memory cell array 30.

The memory cell array 30 includes a dielectric substrate 32 for carrying multiple memory cells 10, each of which is composed of a lower electrode 34 deposited on the substrate 32 and corresponding, for example, to the electrode 12 in FIGS. 1a–1d, a molecular film 36 deposited on the lower electrode 34 and representing the active layer 16 composed of the molecular system or matrix 18 and ionic complexes 20, and a top electrode 38 deposited on the molecular film 36 and corresponding, for example to the electrode 14. As shown in FIG. 3b, in accordance with an embodiment of the present invention, a single top electrode 38 is formed in contact with the molecular films 36 of all memory cell 10.

The thickness of each electrode is approximately 0.5 µm, while the molecular film thickness is in the range from 0.1–0.5 µm. Molecular film in each memory cell 10 may include polyphenylacetylene used as a molecular system, and ~5–7% NaCl used as the ionic complex.

Figure 4:
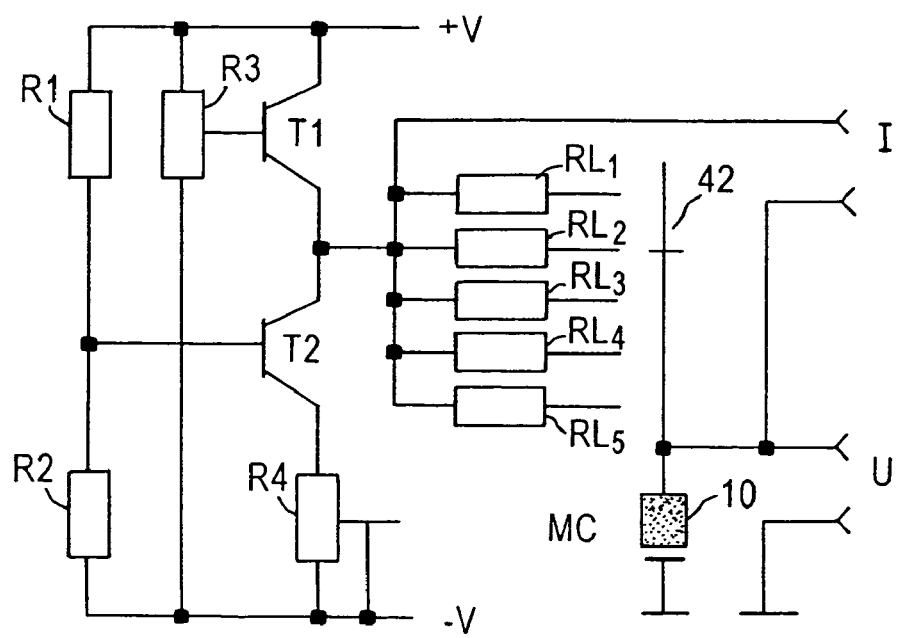
FIG. 4 shows a circuit used for determining current-voltage characteristics of the memory cell.

The current-voltage characteristic of the memory cells 10 during the write, read and erase operation of the memory cell array 30 was measured using the circuit shown in FIG. 4 that comprises different load resistors $R_{L1}$ to $R_{L5}$ used for adjusting the current flowing through the memory cell (MC) 10. A switch 42 is used to selectively connect one of the load resistors $R_{L1}$ to $R_{L5}$ to the MC 10. The current I was determined by measuring the voltage across the respective load resistor $R_L$, whereas the voltage U was measured directly across the MC 10. A circuit composed of transistors T1 and T2, and resistors R1, R2, R3, and R4 is used for supplying and adjusting power supply voltage V.

Attention was paid to the reproducibility of the switching effect, switching times, and storage time. An additional resistor (not shown) was used to limit current in the transition to the "on" state.

A voltage or pulse $P_W$ having a positive polarity with respect to the ground was applied to the top electrode 38 for writing information into the memory cell 10. A voltage or pulse $P_E$ having a negative polarity with respect to the ground was applied to the top electrode 38 for erasing information written into the cell. The lower electrode 34 of the MC 10 is grounded.

The magnitude of the read-out voltage applied to the memory cell 10 did not exceed 50 mV and did not change the memory cell's state.

Figure 5:
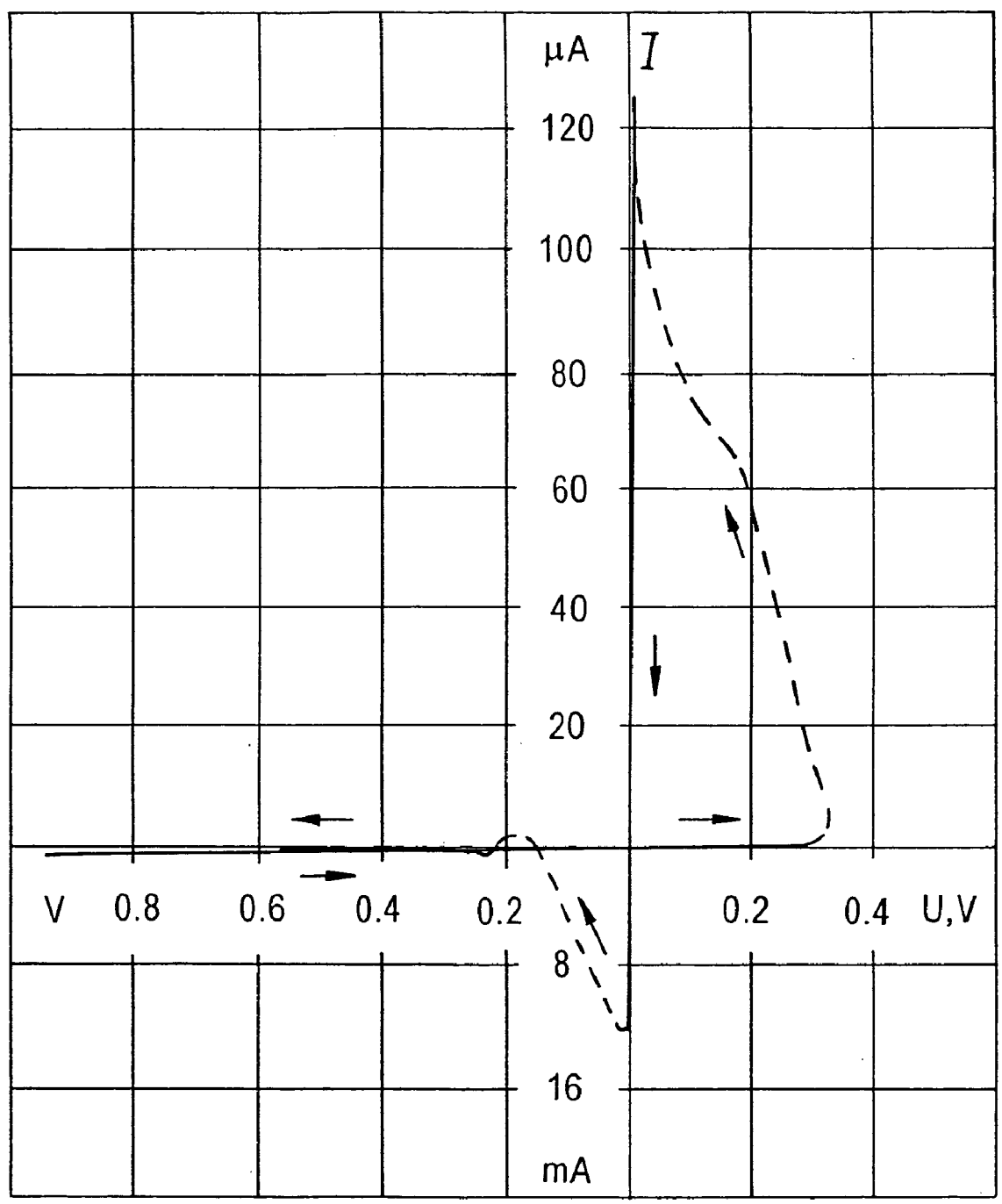
FIG. 5 illustrates voltage and current values in the memory cell during write and erase operations.

FIG. 5 shows a diagram illustrating values of voltage U and current I during write operation and erase operation of an exemplary embodiment of the memory cell 10. For example, the memory cell 10 may be in the "off" state, until a positive (writing) voltage applied to the top electrode 38 reaches a threshold level of approximately 0.3 V. In the "off" state, the electric current through the memory cell 10 is essentially zero. When the applied voltage exceeds the critical voltage, the memory cell shows a negative resistance, with the voltage U across the cell dropping and the current I increasing to more than about 120 µA. The cell 10 is then in the "on" state.

To switch the memory cell 10 from the "on" state back to the "off" state, a negative (erasing) voltage of approximately −1 V is applied to the top electrode 38. This represents the erase cycle. After the erase cycle is completed, the cell is again in the "off" state.

Figure 6:
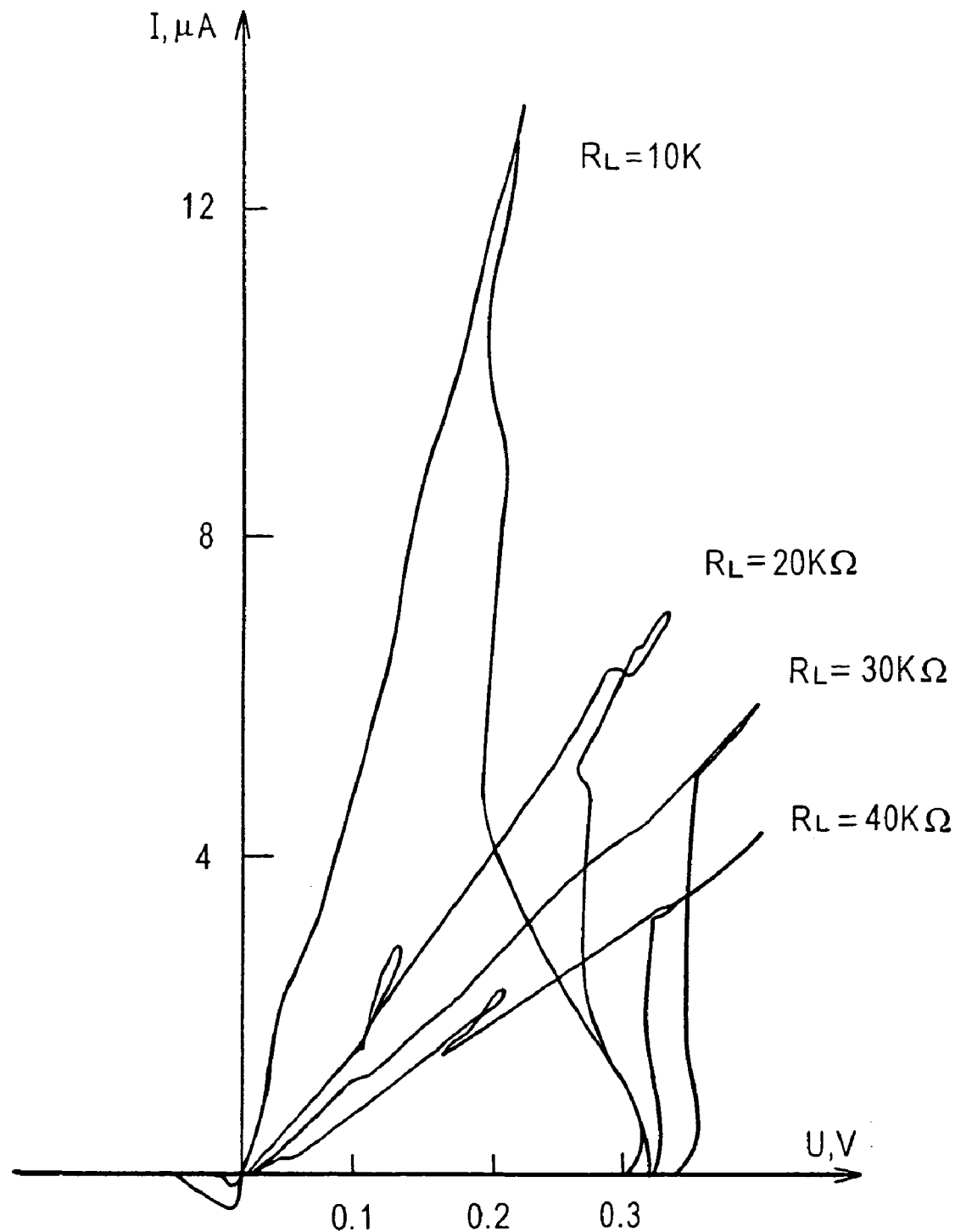
FIG. 6 illustrates voltage and current values in the memory cell under different write conditions.

FIG. 6 shows the exemplary current-voltage characteristics obtained under different write conditions. For example, the memory cell 10 may have impedance in the range between about 10 MΩ and about 100 Ω depending on the switching condition. A state of the memory cell with a desired intermediate impedance can be set by using the same pulse width and pulse voltage, but different load resistors $R_{L1}$–$R_{L5}$. It has been observed experimentally that the impedance of the cell after switching to the "on" state is proportional to the value of the load resistor. FIG. 6 shows the memory cell switching characteristic for four different values of the load resistor between 10 kΩ and 40 kΩ. It should be noted that a memory cell having different values of the cell resistance can be considered as having multiple states. Such cell is capable of storing more than two different bit values in a single cell.

As discussed above, the active layer 16 having a high impedance state and a low impedance state switches from the high impedance state to the low impedance state to enable writing information into the memory cell 10, when the amplitude of a writing voltage applied between the electrodes 12 and 14 exceeds a threshold level. This level is determined by the intensity E of the electric field required to switch the active layer 16 to the low impedance state. Depending on the thickness of the active layer (between the electrodes 12 and 14), the threshold level may be in the range from about 0.1V to about 5V.

In accordance with an embodiment of the present application, a writing pulse signal may be used for switching the active layer 16 to the low impedance state, i.e. to write information into the memory cell. For example, a pulse generator may be used to supply a writing pulse signal $P_W$ to the electrodes 12 and 14 of the memory cell 10. The active layer 16 is switched to the low impedance state, when the amplitude of the pulse signal $P_W$ exceeds a threshold level established for a particular memory cell 10.

Figure 7:
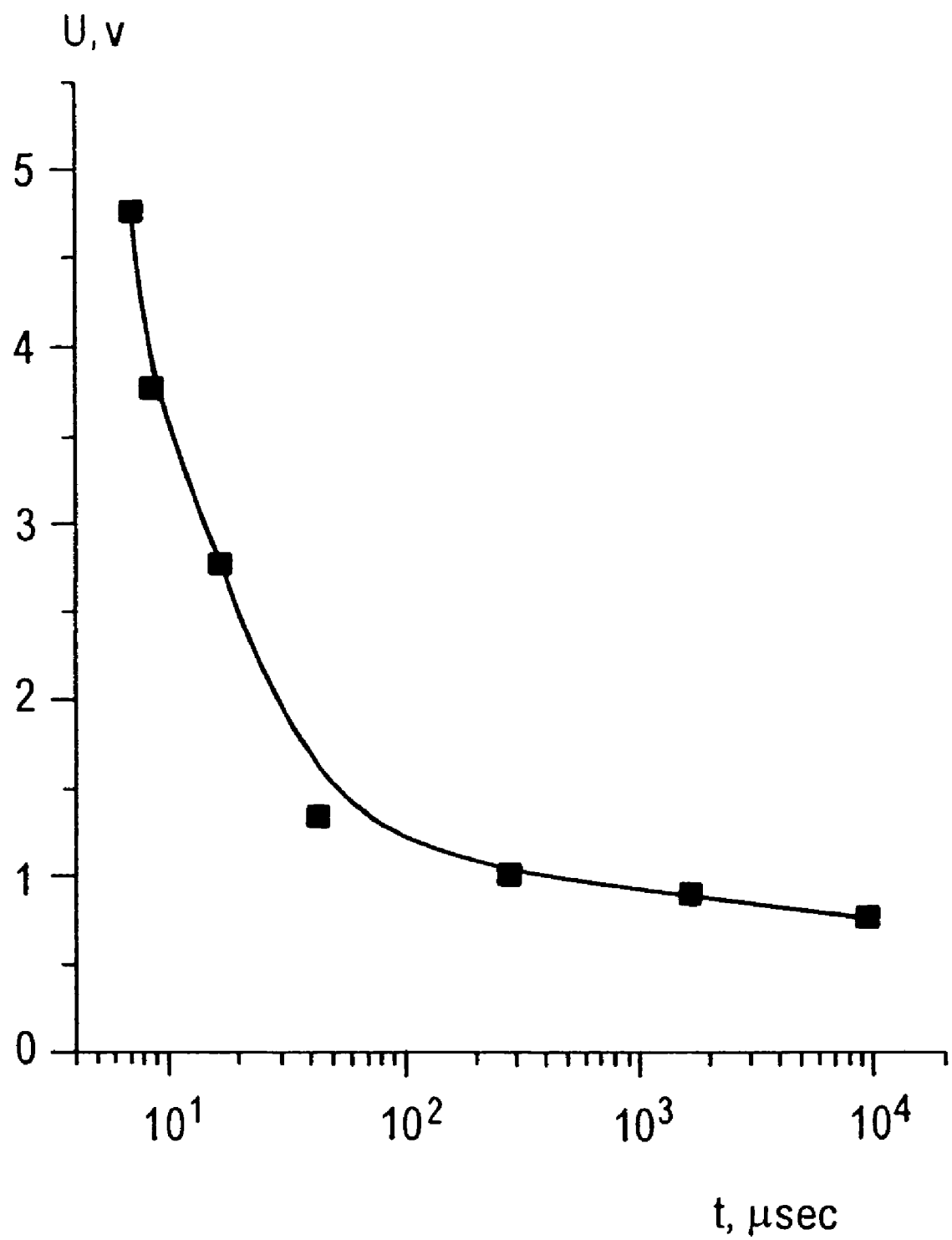
FIG. 7 illustrates dependence of writing pulse amplitude on writing pulse duration.

However, as illustrated in FIG. 7, the amplitude of the pulse $P_W$ required to switch the active layer 16 to the low impedance state depends on the duration of the pulse $P_W$. For example, the memory cell may be switched from the high impedance state to the low impedance state by applying a pulse $P_W$ having amplitude of about 4 V and duration of about 10 µs, whereas for the pulse duration of about 1 ms, the amplitude of about 1 V is sufficient. Hence, the value of the threshold level required to write information into the memory cell 10 is determined as a function of the duration of the pulse $P_W$. Accordingly, the amplitude of the writing signal may be selected depending on the required access time for writing information into the memory cell 10 for a particular application. Also, write speed of the device can be adapted to specific applications.

An erasing pulse signal $P_E$ having a polarity opposite with respect to the polarity of the writing pulse signal $P_W$ is supplied to the memory cell 10 for erasing information written into the memory cell 10. The erasing signal $P_E$ may be supplied by a pulse generator to the electrodes 12 and 14. When the amplitude of the erasing signal exceeds a threshold level established for a particular memory cell 10, the active layer 16 switches from the low impedance state to the high impedance state. The threshold level for erasing information may differ from the threshold level for writing information and depends on the duration of the erasing pulse.

Figure 10:
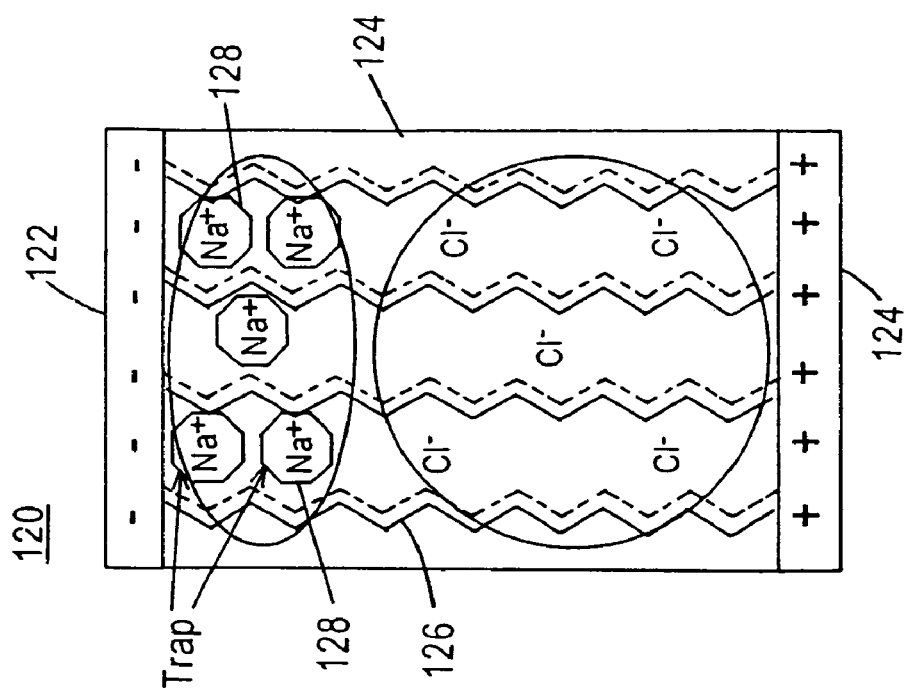
Figure 8:
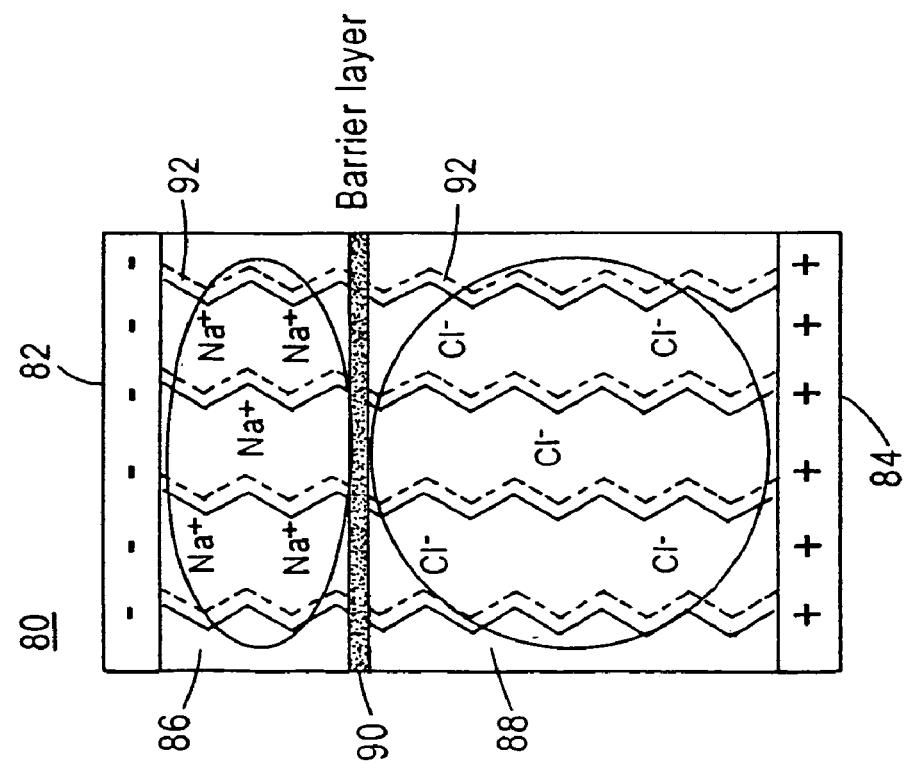
FIG. 8 shows a simplified structure of a memory cell with a barrier layer in accordance with an embodiment of the present invention, FIG. 9 the structure of a memory cell array with a barrier layer, and FIG. 10 a simplified structure of a memory cell with trapping molecular groups in accordance with an embodiment of the present invention.
Figure 9:
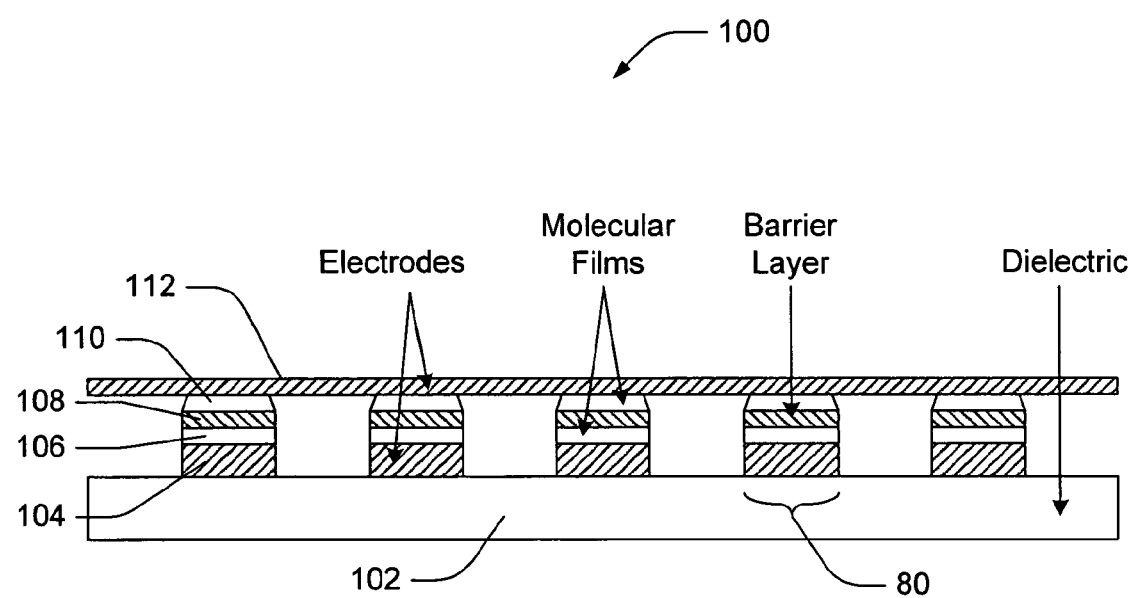

As illustrated in FIGS. 8–10, the data storage time in the memory cell may be increased by incorporating traps and/or barriers in the anisotropic molecular matrix. The traps and/or barriers are designed so as to trap the dissociated charges when no electric field or only a small read-out current is applied to the memory cell, while allowing the charges to move around in higher electric fields.

Referring to FIG. 8, a memory cell 80 in accordance with an embodiment of the present invention includes electrodes 82 and 84, and an active region provided between the electrodes 82 and 84 and including a first active layer 86 and a second active layer 88, and a barrier layer 90 provided between the active layers 86 and 88.

Each of the active layers 86 and 88 is similar to the active layer 16 described above in connection with FIGS. 1a–1d. Hence, each of the active layers 86 and 88 include a molecular system 92, such as a polyconjugated compound or a compound formed based on aromatic or heterocyclic molecules, and ionic complexes including, for example, ions of Na and Cl having opposite charges. The barrier layer 90 may be made of a polymer, metal or conducting oxide having density higher the density of the molecular system 92.

As explained in more detail below, the barrier layer 90 is provided to restrict movement of the ions between the first active layer 86 and the second active layer 88 when the intensity E of the electric field provided between the electrodes 82 and 84 is no more than the writing threshold value required for writing information into the memory cell 80 or erasing threshold value required for erasing the information written into the memory cell 80.

In particular, FIG. 8 illustrates an "on" or low impedance state of the memory cell 80 similar to the state illustrated in FIG. 1c, when anions and cations included in the ionic complex become sufficiently separated to provide a high electrical conductivity of the active region in the stable mode. As illustrated in FIGS. 1a–1c, the memory cell is switched into the low impedance mode when the intensity of the electric field applied between the electrodes 82 and 84 exceeds the threshold value. For example, the electric filed may be applied to provide a potential on the electrode 82 negative with respect to the potential on the electrode 84. As a result, the majority of the cations moves to the first active layer 86 adjacent the negatively charged electrode 82, and the majority of the anions moves to the second active layer 88 adjacent the positively charged electrode 84.

When no electric filed is applied or the electric field intensity is reduced, the anions and cations may gradually return to their original positions illustrated in FIG. 1a. Hence, the information written to the memory cell 90 may be erased.

The barrier layer 90 restrict the movement of the ions to prevents the cations from returning to the active layer 88 and to prevent the anions from returning to the active layer 86. Hence, the information written into the memory cell 80 is prevented from being erased. Accordingly, the barrier layer 90 substantially increases the data storage time or data retention time of the memory cell 80.

However, when the intensity of the electric field between the electrodes 82 and 84 exceeds the writing or erasing threshold value, ions are enabled to move through the barrier layer 90. Therefore, the barrier layer 90 does not prevent writing information into the memory cell 80 or erasing information from the memory cell 80.

FIG. 9 illustrates a cross-section of a memory cell array 100 including multiple memory cells 80 having a barrier layer in accordance with an embodiment of the present invention. The memory cell array 100 includes a dielectric substrate 102, a lower electrode 104, a first molecular film 106, a barrier layer 108, a second molecular film 110 and a top electrode 112.

The dielectric substrate is provided for carrying multiple memory cells 80 each of which contains the lower electrode 104, deposited on the substrate 102. The lower electrode 104 may correspond, for example, to the electrode 82 in FIG. 8. The first molecular film 106 having thickness of about 500 Å is deposited on the lower electrode 104. The first molecular film 106 corresponds to the first active layer 86 in FIG. 8.

The barrier layer 108 corresponding to the barrier layer 90 in FIG. 8 is deposited on the first active layer 106. The thickness of the barrier layer may be about 20–50 Å. Then, the second molecular film 110 representing the second active layer 88 is deposited on the barrier layer 108. The thickness of the second molecular film 110 is about 300–500 Å. The top electrode 112 corresponding to the electrode 84 is deposited on the second molecular film 110. As shown in FIG. 9, in accordance with an embodiment of the present invention, a single top electrode 112 is formed in contact with the molecular films 110 of all memory cells 80. Molecular film in each memory cell 80 may include polyphenylacetylene used as a molecular system, and ~5–7% NaCl used as the ionic complex.

Referring to FIG. 10, a memory cell 120 in accordance with another embodiment of the present invention comprises includes electrodes 122 and 124, and an active layer 124 provided between the electrodes 122 and 124. The active layer 124 includes a molecular system 126, such as a polyconjugated compound or a compound formed based on aromatic or heterocyclic molecules, and ionic complexes including, for example, ions of Na and Cl having opposite charges.

In addition, the active layer 124 includes trapping molecular groups 128 for trapping at least one of the ions included in the ionic complex. For example, as shown in FIG. 10, the trapping molecular groups 128 may trap positively charged ions of Na when the intensity E of the electric field provided between the electrodes 122 and 124 is no more than the writing threshold value required for writing information into the memory cell 120 or erasing threshold value required for erasing the information written into the memory cell 120.

For example, the trapping molecular groups 128 for trapping ions of Na may be made of a crown ether or its cyclic analogue. In particular, the cyclic analogue of a crown ether traps ions of Na and strongly hold the trapped ions when the intensity E of the electric field provided between the electrodes 122 and 124 is no more than the writing or erasing threshold value. However, the cyclic analogue of a crown ether does not substantially restrict movements of ions when the intensity of the electric field exceeds the writing or erasing threshold value.

In particular, FIG. 10 illustrates an "on" or low impedance state of the memory cell 120 similar to the state illustrated in FIG. 1c, when anions and cations included in the ionic complexes become sufficiently separated to provide a high electrical conductivity of the active layer in the stable mode. As illustrated in FIGS. 1a–1c, the memory cell is switched into the low impedance mode when the intensity of the electric field applied between the electrodes 122 and 124 exceeds the threshold value. For example, the electric field may be applied to provide a potential on the electrode 122 negative with respect to the potential on the electrode 124. As a result, the majority of the cations move to the area of the active layer 124 adjacent the negatively charged electrode 82, and the majority of the anions move to region adjacent the positively charged electrode 84.

When no electric filed is applied or the electric field intensity is reduced, the anions and cations may gradually return to their original positions illustrated in FIG. 1a. Hence, the information written to the memory cell 120 may be erased.

The trapping molecular groups 128 trap the ions of Na to prevent them from moving towards the ions of Cl when the electric filed intensity is no more than the writing or erasing threshold value. Hence, the trapping molecular groups 128 substantially increase the data storage time or data retention time of the memory cell 120.

However, the trapping molecular groups 128 do not substantially interfere with ion diffusion when the electric field intensity exceeds the writing or erasing threshold value. For example, they release the trapped ions of Na shown in FIG. 10. Therefore, the trapping molecular groups 128 do not prevent writing information into the memory cell 120 or erasing information from the memory cell 120.

The memory cell 120 having the trapping molecular groups 128 may also contain a barrier layer similar to the barrier layer 90 (FIG. 8) inserted in the active layer 124 to separate the region adjacent the electrode 122 from the region adjacent the electrode 124. When the electric filed intensity is no more than the writing or erasing threshold value, the barrier layer restricts ion diffusion between the region adjacent the electrode 122 and the region adjacent the electrode 124 to further increase the data storage time or data retention time of the memory cell 120.

As discussed above, it is possible to design the memory chips for computer systems based on the above-described molecular memory cells. The electronic circuitry of a molecular memory chip can be based on that of well-developed DRAM chips. Depending on the "state" of the memory cell, i.e., a metastable or stable state, the circuit can work as SRAM, DRAM or flash memory. Furthermore, unlike conventional floating gate devices, this memory cell described in the present application is immune to radiation. The information is stored as the value of memory cell resistance. Memory chips storing several bits per single memory cell can be produced, which may enable the development of improved artificial neurons for neural networks and neural computers.

While the invention has been disclosed in connection with the preferred embodiments shown and described in detail, various modifications and improvements thereon will become readily apparent to those skilled in the art.

What is claimed is:

1. A switching device comprising:
    an active region with a high-impedance state and a low-impedance state and comprising a molecular matrix and ionic complexes distributed in the matrix, each of the ionic complexes comprising at least a pair of ions having opposite charges;
    the active region is responsive to a switching signal for switching between the high-impedance state and the low-impedance state when the amplitude of the switching signal exceeds a threshold level that is determined based on the duration of the switching signal.

2. The switching device of claim 1, the switching signal causes displacement of the ions in the ionic complexes to switch the active region from the high-impedance state to the low-impedance state.

3. A method of switching a device with a high-impedance state and a low-impedance state and comprising a molecular matrix and ionic complexes distributed in the matrix, each of the ionic complexes comprising at least a pair of ions with opposite charges, the method comprising:
    determining a threshold level for switching the device based on the duration of a switching signal for switching the device;
    and applying the switching signal having an amplitude exceeding the threshold level to switch the device between the high-impedance state and the low-impedance state.

4. The method of claim 3, further comprising applying an electric field to cause displacement of the ions in the ionic complexes for switching from the high-impedance state to the low-impedance state.

5. A method of switching a switching device having a pair of electrodes, and a first active layer and a second active layer sandwiched between the electrodes, each of the first and second active layers comprising a molecular system and ionic complexes, each of the ionic complexes comprising at least a first ion and a second ion, the method comprising:
    applying an electric field having intensity exceeding a threshold value for switching the device from a high-impedance state to a low-impedance state by displacing the ions included in the ionic complex so as to place majority of the first ions into the first active layer and majority of the second ions into the second active layer; and
    providing a barrier layer between the first active layer and the second active layer to prevent the first ions from returning to the second active layer when the electric field intensity is no more than the threshold value.

6. The method of claim 5, the barrier layer further prevents the second ions from returning to the first active layer.

7. The method of claim 6, the switching device is switched between the high-impedance state and the low-impedance state to write information.

8. The switching device of claim 1, the active region switches from a low-impedance state to a high-impedance state when the switching signal exceeds the threshold level.

9. The switching device of claim 1, the active region switches from a high-impedance state to a low-impedance state when the switching signal exceeds the threshold level.

10. The switching device of claim 1, the ionic complex comprises ions of Na and Cl.

11. The switching device of claim 1, the ionic complex comprises ions of Cs and Cl.

12. The switching device of claim 1, the active region permits writing information when the amplitude of a switching signal of a first polarity exceeds the threshold value.

13. The switching device of claim 1, the active region permits erasing information when the amplitude of a switching signal of a second polarity exceeds a threshold value of the second polarity.

14. The switching device of claim 1, the active region permits reading information when the amplitude of the switching signal is less than or equal to the threshold value.

15. The method of claim 3, further comprising writing information to a memory cell when the switching signal amplitude exceeds the threshold level.

16. The method of claim 15, further comprising applying a switching signal of an opposite polarity with an amplitude greater than a threshold level of the opposite polarity to erase information from the memory cell.

17. The method of claim 3, further comprising applying a switching signal with an amplitude no greater than the threshold level to read information from a memory cell.

18. The method of claim 5, the ionic complex comprises ions of Na and Cl.

19. The method of claim 5, further comprising constructing the barrier layer of a material with a higher density than the density of the molecular system.

20. The method of claim 5, further comprising providing a trapping molecular group in the molecular system of at least one of the active layers, the trapping molecular group traps at least one of the ions of the ionic complex.

* * * * *